(12) United States Patent
Ishibashi et al.

(10) Patent No.: US 11,479,848 B2
(45) Date of Patent: Oct. 25, 2022

(54) FILM FORMING APPARATUS AND METHOD

(71) Applicant: TOKYO ELECTRON LIMITED, Tokyo (JP)

(72) Inventors: Shota Ishibashi, Nirasaki (JP); Hiroyuki Toshima, Nirasaki (JP); Hiroyuki Iwashita, Nirasaki (JP); Tatsuo Hirasawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1 day.

(21) Appl. No.: 17/143,924

(22) Filed: Jan. 7, 2021

(65) Prior Publication Data
US 2021/0207261 A1 Jul. 8, 2021

(30) Foreign Application Priority Data
Jan. 8, 2020 (JP) .............................. JP2020-001565

(51) Int. Cl.
*H01J 37/34* (2006.01)
*C23C 14/35* (2006.01)
(52) U.S. Cl.
CPC ........ *C23C 14/351* (2013.01); *H01J 37/3447* (2013.01)
(58) Field of Classification Search
None
See application file for complete search history.

(56) References Cited

U.S. PATENT DOCUMENTS 4,776,868 A * 10/1988 Trotter, Jr. .............. B29C 41/02
264/1.1
5,833,815 A * 11/1998 Kim .................... H01J 37/3455
204/192.12

FOREIGN PATENT DOCUMENTS

JP 10102246 A * 4/1998 .......... H01J 37/3408
JP 2003-293130 A 10/2003

* cited by examiner

*Primary Examiner* — Jason Berman
(74) *Attorney, Agent, or Firm* — Fenwick & West LLP

(57) ABSTRACT

A film forming apparatus includes a target holder that holds a target facing a substrate and extending in a predetermined direction on a horizontal plane, a magnet unit including a pair of magnet assemblies each having magnets and disposed at a back side of the target holder, a pair of shielding members disposed between the target and the substrate to extend from the target toward the substrate, and a moving mechanism configured to reciprocate the magnet unit between one end and the other end in the predetermined direction. The magnet assemblies are arranged along the predetermined direction, and each of the shielding members is disposed, in plan view, on a boundary line between a first region where only one of the magnet assemblies passes during a reciprocating motion of the magnet unit and a second region where both of the magnet assemblies pass therethrough during the reciprocating motion.

14 Claims, 5 Drawing Sheets

FILM FORMING APPARATUS AND METHOD

CROSS-REFERENCE TO RELATED APPLICATION

This application claims priority to Japanese Patent Application No. 2020-001565, filed on Jan. 8, 2020, the entire contents of which is incorporated herein by reference.

TECHNICAL FIELD

The present disclosure relates to a film forming apparatus and method.

BACKGROUND

Japanese Patent Application Publication No. 2003-293130 (JP 2003-293130) discloses a sputtering apparatus including a sputtering chamber, a substrate holder that can be loaded into and unloaded from the sputtering chamber, and a magnetron cathode. In the sputtering apparatus, the magnetron cathode includes: a target having a shape in which elliptic arc-shaped protrusions are formed at both ends of a rectangular portion in a longitudinal direction and provided to face the substrate holder while being spaced apart from the substrate holder; and a magnet unit structure provided to face a back side of the target while being spaced apart from the back side of the target. Further, the magnet unit structure includes a mounting member, and a plurality of magnet units mounted onto the mounting member. The magnet unit structure is connected to a movement mechanism for reciprocating the mounting member in the longitudinal direction of the target. Further, among the magnet units, magnet units mounted onto both ends of the mounting member respectively include yokes, at least a part of each yoke being formed in an elliptic arc shape to correspond to an erosion region for the target, an outer peripheral magnet formed along an outer circumference of the yoke, and a central magnet having a reverse polarity to the outer peripheral magnet disposed near the central portion of the yoke.

SUMMARY

In view of the above, the present disclosure provides a technique for preventing variation in a coating amount due to sputtered particles at a peripheral edge of a substrate in the case of forming a film on the substrate by magnetron sputtering.

In accordance with an aspect of the present disclosure, there is provided a film forming apparatus for forming a film on a substrate by magnetron sputtering, including: a target holder configured to hold a target at a front side such that the target faces the substrate serving as a film formation target and extends in a predetermined direction on a horizontal plane; a magnet unit including at least a pair of magnet assemblies, each of which is formed by arranging multiple magnets, the magnet unit being disposed at a back side of the target holder; a pair of shielding members disposed between the target held by the target holder and the substrate to extend in a direction from the target toward the substrate; and a moving mechanism configured to reciprocate the magnet unit between one end and the other end in the predetermined direction of the target held by the target holder. Further, the pair of the magnet assemblies are arranged along the predetermined direction, and each of the shielding members is disposed, in plan view, on a boundary line between a first region where only one of the magnet assemblies of the pair passes therethrough during a reciprocating motion of the magnet unit and a second region where both of the magnet assemblies of the pair pass therethrough during the reciprocating motion of the magnet unit.

BRIEF DESCRIPTION OF THE DRAWINGS

The objects and features of the present disclosure will become apparent from the following description of embodiments, given in conjunction with the accompanying drawings, in which.

DETAILED DESCRIPTION

In a semiconductor device manufacturing process, a film forming process for forming a desired film such as a metal film is performed on a substrate such as a semiconductor wafer (hereinafter referred to as "wafer." As an example of the film forming process, magnetron sputtering is known.

Figure 1:
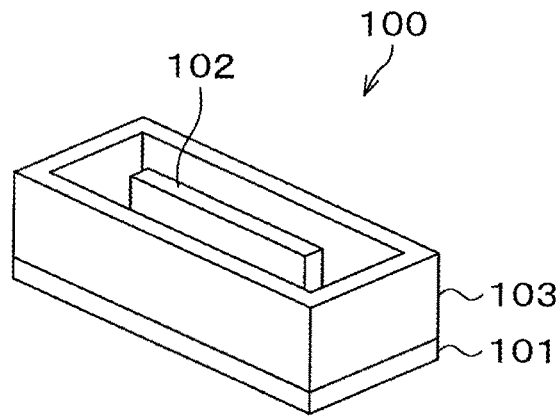
FIG. 1 is a perspective view for explaining an example of a magnet assembly.

In a film forming apparatus for performing magnetron sputtering, a flat plate-shaped target is disposed to face, e.g., a substrate serving as a film formation target. Further, when a side of the target facing the substrate serving as the film formation target is set to a front side, a magnet assembly having a larger area than that of the substrate is disposed at a back side of the target. As shown in FIG. 1, the magnet assembly 100 has a configuration in which a rectangular parallelepiped central magnet 102 and an outer peripheral magnet 103 having a rectangular ring shape in plan view are arranged on a flat plate-shaped yoke 101. The central magnet 102 is disposed to extend along a longitudinal direction of the yoke 101, and the outer peripheral magnet 103 is disposed to surround four sides of the central magnet 102 in plan view. Further, the central magnet 102 and the outer peripheral magnet 103 are magnetized in opposite directions in a direction perpendicular to an upper surface of the yoke 101.

A horizontal magnetic field is generated on a bottom surface of the target by the above-described magnet assembly. When a radio frequency (RF) power is supplied to the target, for example, an inert gas such as Ar gas introduced into a film formation atmosphere is ionized. Drift of electrons generated by ionization arises due to the magnetic field and an electric field generated by the RF power, thereby generating high-density plasma. A target surface is sputtered by ions generated by ionization of inert gas molecules in the plasma, and the sputtered particles are deposited on the substrate to form a thin film.

A sputtering region on the target surface has an annular shape along the arrangement of the magnets in the magnet assembly. Therefore, when the magnet assembly is fixed, only a part of the target surface is eroded annularly, which results in low efficiency in the use of the target. Accordingly, the magnet assembly is reciprocated in an extension direction of the target so that the target is uniformly eroded. As a result, in-plane uniformity of the thickness of the thin film formed on the substrate is obtained.

For example, JP 2003-293130 discloses that a magnet unit structure including a plurality of magnet units is reciprocated in a longitudinal direction of the target.

However, during the magnetron sputtering, the substrate serving as a film formation target may be rotated, the substrate may be moved in a direction orthogonal to the extension direction of the target disposed on a horizontal plane without rotating, or the substrate may not be moved or rotated. In the case where the substrate serving as the film formation target is not rotated, if the substrate has a pattern with a rectangular cross section such as a line and space pattern, a coating state of the sputtered particles reaching a side surface of the pattern may become different between the center of the substrate and the edge of the substrate, even though the reciprocating movement is performed as described in JP 2003-293130. This will be described in detail below.

Figure 2:
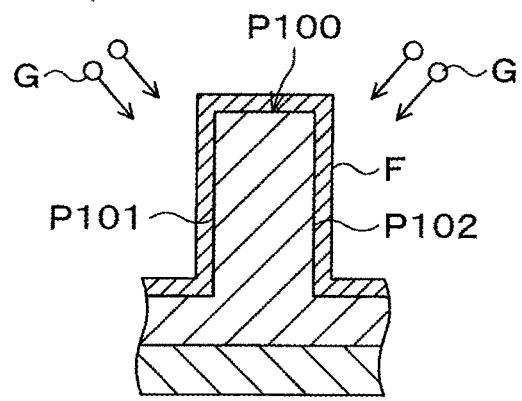
FIGS. 2 and 3 are diagrams for explaining a problem of the prior art.
Figure 3:
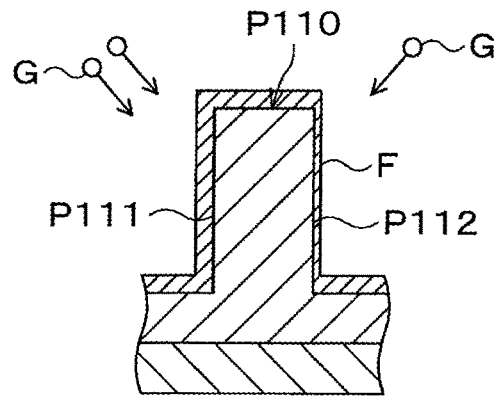

For example, as shown in FIG. 2, at a central portion of the substrate, the number of sputtered particles G reaching a substrate central side surface P101 of a pattern P100 and the number of sputtered particles G reaching a substrate peripheral side surface P102 of the pattern P100 are substantially the same. Therefore, at the central portion of the substrate, the coating amount of the sputtered particles G, i.e., the thickness of a sputtered film F, does not vary between the substrate central side surface P101 and the substrate peripheral side surface P102 of the pattern P100. On the other hand, as shown in FIG. 3, at a peripheral portion of the substrate, the number of sputtered particles G reaching a substrate peripheral side surface P112 of a pattern P110 is smaller than the number of sputtered particles G reaching a substrate central side surface P111 of the pattern P110. This is because the number of particles G sputtered from a portion of the target positioned outside the substrate is smaller than the number of particles G sputtered from a portion of the target positioned above the substrate. Therefore, at the peripheral portion of the substrate, the coating amount of the sputtered particles G, i.e., the thickness of the sputtered film F, may vary between the substrate central side surface P111 and the substrate peripheral side surface P112. If the area of the target is considerably larger than that of the substrate, such variation does not occur. However, if the area of the target becomes excessively large, a ratio of sputtered particles contributing to film formation to the total sputtered particles decreases, resulting in the waste of the high-priced target.

Hence, the technique of the present disclosure prevents variation in the coating amount of sputtered particles at the peripheral portion of the substrate in the case of forming a film on the substrate by magnetron sputtering. In particular, the technique of the present disclosure prevents such variation without increasing the area of the target.

Hereinafter, the configuration of the film forming apparatus according to the present embodiment will be described with reference to the drawings. In this specification, like reference numerals will be given to like parts having substantially the same functions, and redundant description thereof will be omitted.

Figure 4:
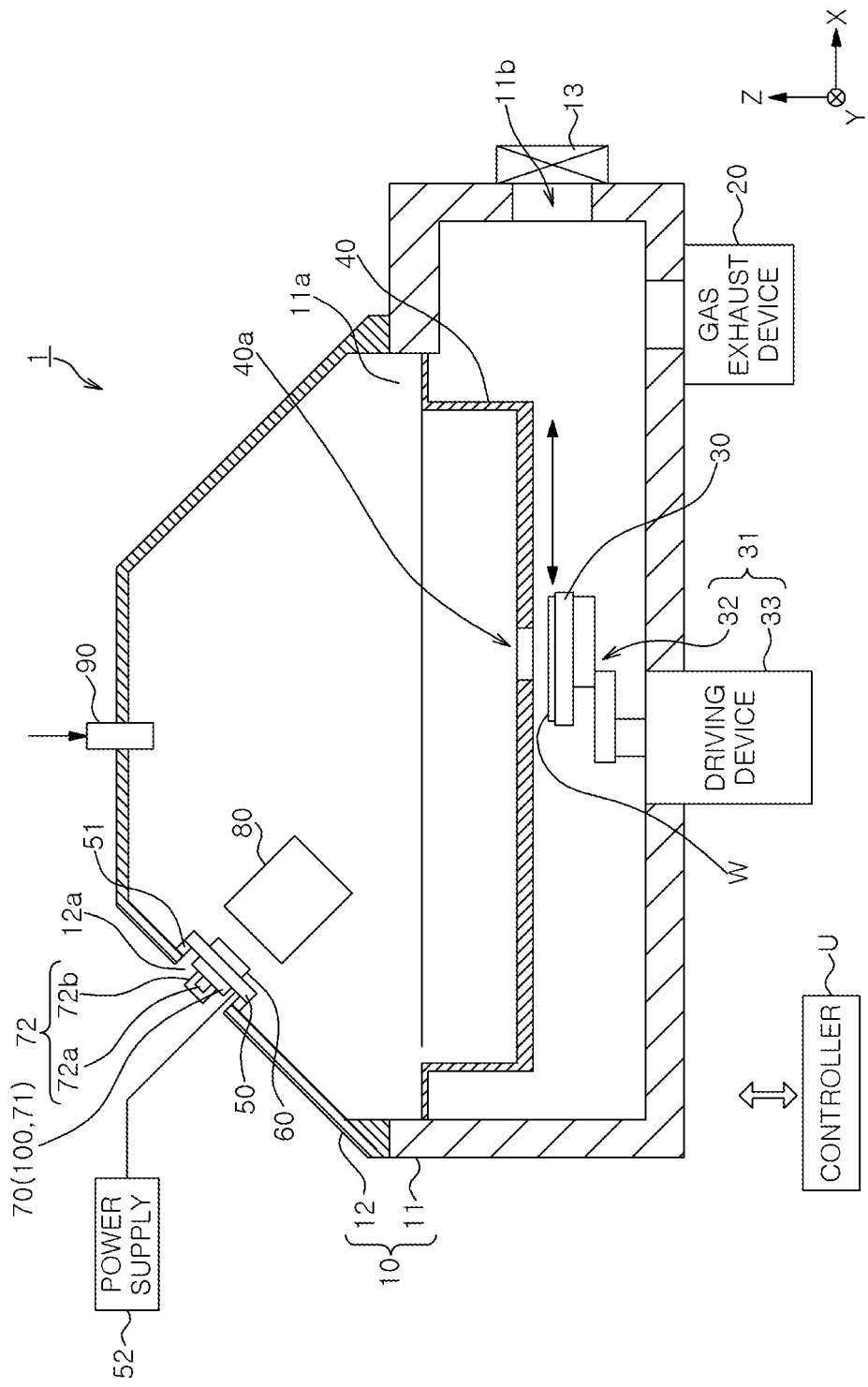
FIG. 4 is a vertical cross-sectional view schematically showing a configuration of a film forming apparatus according to the present embodiment.
Figure 5:
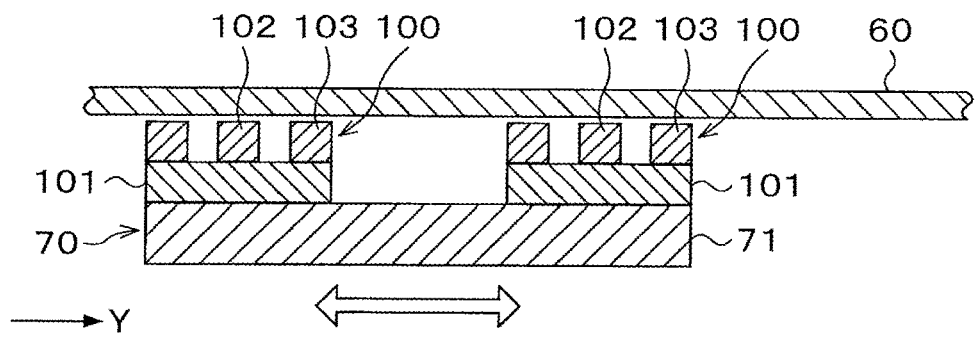
FIG. 5 is a cross-sectional view schematically showing a magnet unit.
Figure 6:
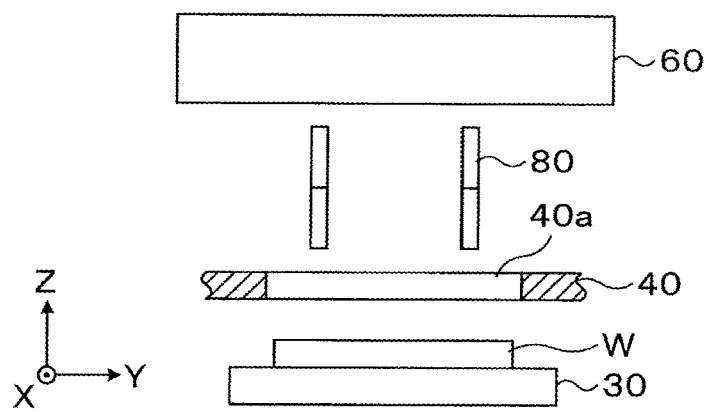
FIG. 6 is a diagram for explaining a shielding member and shows only main parts of a processing chamber.
Figure 7:
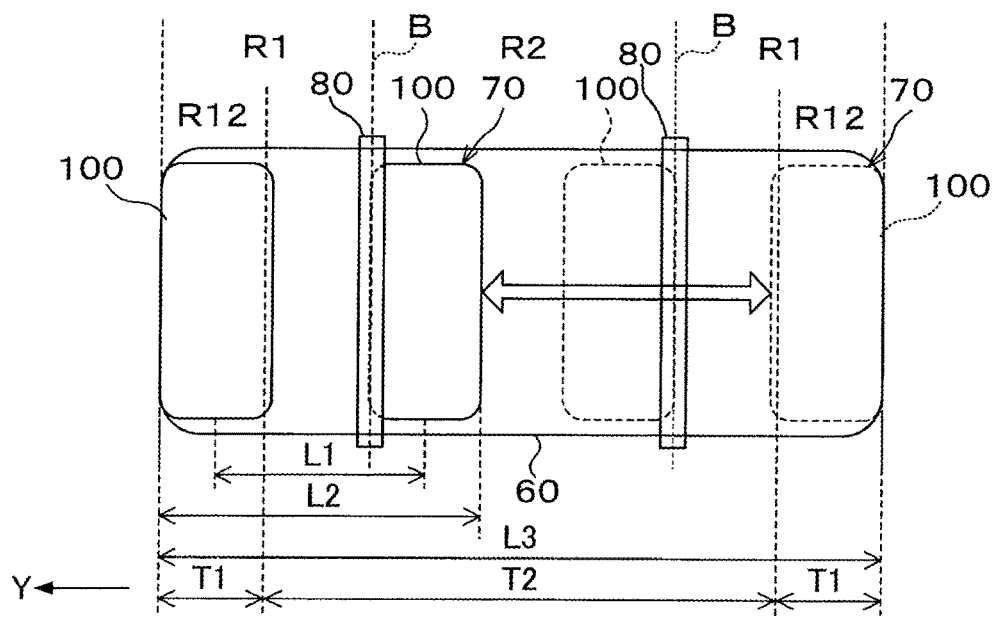
FIG. 7 is a diagram for explaining a position of the shielding member.
Figure 8:
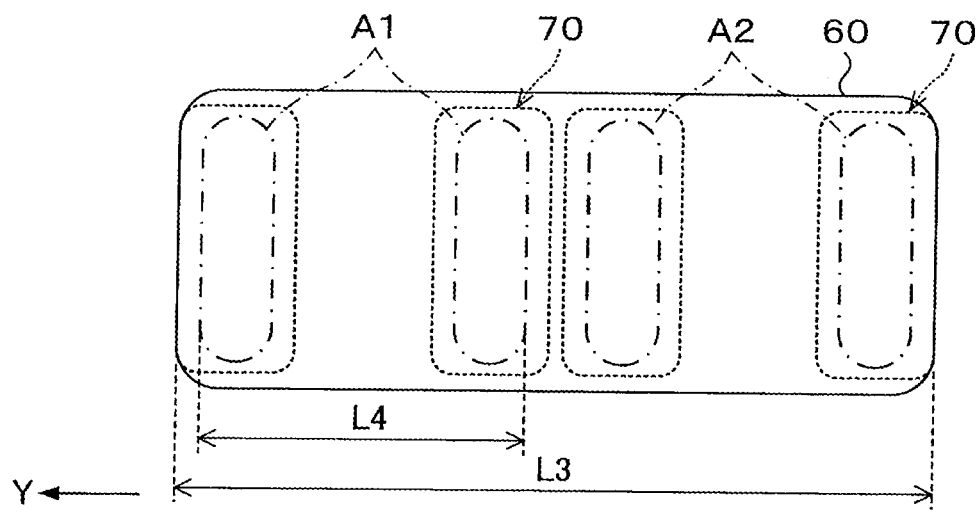
FIG. 8 is a diagram for explaining a distance between a pair of magnet assemblies included in the magnet unit.

FIG. 4 is a vertical cross-sectional view schematically showing the configuration of the film forming apparatus 1 according to the present embodiment. FIG. 5 is a cross-sectional view schematically showing a magnet unit to be described later. FIG. 6 is a diagram for explaining a shielding member to be described later, and shows only main parts of a processing chamber to be described later. FIG. 7 is a diagram for explaining a position of a shielding member. FIG. 8 is a diagram for explaining a distance between a pair of magnet assemblies included in the magnet unit.

The film forming apparatus 1 shown in FIG. 4 is configured to form a film on a substrate by sputtering. Specifically, the film forming apparatus 1 is configured to form a metal film on a wafer W serving as a substrate. The film forming apparatus 1 includes a processing chamber 10.

The processing chamber 10 is configured such that an inner pressure thereof can be reduced, and accommodates the wafer W. The processing chamber 10 includes a chamber body 11 and a lid 12. The chamber body 11 and the lid 12 are made of, for example, aluminum, and are connected to a ground potential.

The chamber body 11 is formed in a hollow shape having an opening 11a. More specifically, the chamber body 11 is formed in a cylindrical shape having the opening 11a at the top and a closed bottom.

A gas exhaust device 20 for reducing pressure in a sealed space in the processing chamber 10 is connected to a bottom portion of the chamber body 11 through an APC valve (not shown). A loading/unloading port 11b for the wafer W is formed on a sidewall of the chamber body 11, and a gate valve 13 for opening and closing the loading/unloading port 11b is disposed at the loading/unloading port 11b.

The lid 12 has a dome shape and is attached onto the chamber body 11 to enclose the opening 11a of the chamber body 11.

Further, an O-ring (not shown) is disposed between the chamber body 11 and the lid 12 to seal a gap therebetween.

A substrate support 30 on which the wafer W is horizontally placed is disposed in the processing chamber 10. The substrate support 30 includes a heater (not shown) for heating the wafer W. Further, a cooling mechanism may be provided instead of the heater, or both the heater and the cooling mechanism may be provided.

The substrate support 30 is connected to a substrate support moving mechanism 31.

The substrate support moving mechanism 31 is configured to move the substrate support 30 while maintaining the surface of the wafer W horizontally. The substrate support moving mechanism 31 moves the substrate support 30 such that the wafer W placed on the substrate support 30 moves in one direction (X direction in FIG. 4) on the horizontal plane.

For example, the substrate support moving mechanism 31 includes a multi joint arm 32 and a driving device 33.

The substrate support 30 is attached to one end of the multi joint arm 32, and the driving device 33 is connected to the other end of the multi joint arm 32.

The driving device 33 is configured to generate a driving force for moving one end of the multi joint arm 32 in one direction on the horizontal plane (X direction in FIG. 4; hereinafter, may be referred to as "apparatus width direction") to move the substrate support 30 in the apparatus width direction. Further, the driving device 33 is configured to generate a driving force for moving one end of the multi-joint arm 32 in a vertical direction (Z direction in FIG. 4; hereinafter, may be referred to as "apparatus height direction") to move the substrate support 30 in the apparatus height direction.

The driving device 33 has, e.g., a motor for generating the driving forces.

Further, a slit plate 40 is disposed in the processing chamber 10. The slit plate 40 is a plate-shaped member having a slit 40a. The slit plate 40 extends horizontally above a space where the wafer W is moved by the substrate support moving mechanism 31.

The slit 40a is formed through the slit plate 40 in the vertical direction. In plan view, the slit 40a has an elongated rectangular shape in a direction (Y direction in FIG. 4, hereinafter referred to as "apparatus depth direction") orthogonal to the apparatus width direction (X direction in FIG. 4) that is the direction in which the wafer W is moved by the substrate support moving mechanism 31. The length of the slit 40a in the apparatus width direction (X direction in FIG. 4) is smaller than the diameter of the wafer W, and the length of the slit 40a in the apparatus depth direction (Y direction in FIG. 4) is greater than the diameter of the wafer W.

Further, in the processing chamber 10, a target holder 50 made of a conductive material is disposed above the slit plate 40. The target holder 50 holds the target 60 such that the target 60 is disposed in the processing chamber 10. The target holder 50 is attached to the lid 12. A through-hole 12a is formed at a position where the target holder 50 is attached to the lid 12. An insulating member 51 is disposed on an inner wall surface of the lid 12 to surround the through-hole 12a. The target holder 50 is attached to the lid 12 through the insulating member 51 to block the through-hole 12a.

The target holder 50 holds the target 60 at a position above the slit plate 40 such that the target 60 is tilted diagonally upward with respect to the slit 40a of the slit plate 40, for example. Further, the target holder 50 holds the target 60 at a front side thereof such that the target 60 faces the slit 40a, i.e., the target 60 faces the wafer W serving as a film formation target through the slit 40a, and the target 60 extends in the apparatus depth direction (Y direction in FIG. 4).

The target 60 is formed in a rectangular shape in plan view. The length of the target 60 in the apparatus depth direction (Y direction in FIG. 4) is greater than the diameter of the wafer W serving as the film formation target (see FIG. 6). When the wafer W has a diameter of 300 mm, the length of the target 60 in the apparatus depth direction is, for example, in a range of 400 mm to 500 mm. The length of the target 60 in the direction orthogonal to the apparatus depth direction is, for example, in a range of 150 mm to 200 mm.

A power supply 52 is connected to the target holder 50, and a negative DC voltage is applied from the power supply 52 to the target holder 50. Alternatively, an AC voltage may be applied instead of the negative DC voltage.

A magnet unit 70 is disposed at a back side of the target holder 50 outside the processing chamber 10.

As shown in FIG. 5, the magnet unit 70 includes a pair of magnet assemblies 100 and a support plate 71. As shown in FIG. 1, each magnet assembly 100 has a configuration in which the rectangular parallelepiped central magnet 102 and the peripheral magnet 103 having a rectangular ring shape in plan view are arranged on the flat plate-shaped yoke 101. The central magnet 102 is disposed to extend along a longitudinal direction of the yoke 101, and the outer peripheral magnet 103 is disposed to surround four sides of the central magnet 102 in plan view. Further, the central magnet 102 and the outer peripheral magnet 103 are magnetized in opposite directions in a direction perpendicular to the upper surface of the yoke 101.

In this example, each magnet assembly 100 is disposed such that the central magnet 102 extends in a direction orthogonal to the apparatus depth direction (Y direction in FIG. 5) in plan view. Further, the length of each magnet assembly 100 in the apparatus depth direction (Y direction in FIG. 5) is, for example, in a range of about ⅛ to ⅕ of the length of the target 60 in the apparatus depth direction. Specifically, the length of each magnet assembly 100 in the apparatus depth direction is in a range of 45 mm to 100 mm. The length of each magnet assembly 100 in the direction orthogonal to the apparatus depth direction (Y direction in FIG. 5) is substantially the same as the length of the target 60 in the direction orthogonal to the apparatus depth direction. The thickness of the magnet assembly 100 is, for example, in a range of 25 mm to 35 mm.

The support plate 71 is formed in a flat plate shape. The support plate 71 supports the pair of magnet assemblies 100. Specifically, the magnet assemblies 100 are supported in parallel on the support plate 71 such that the distance between the pair of magnet assemblies 100 becomes constant. In other words, the pair of magnet assemblies 100 are fixed in parallel to the support plate 71.

As shown in FIG. 4, the support plate 71 is connected to the moving mechanism 72.

The moving mechanism 72 includes, for example, a rail 72a extending along the apparatus depth direction (Y direction in FIG. 4) and a driving unit 72b having, for example, a motor. The driving force generated by the driving unit 72b causes the support plate 71 to move along the rail 72a in the apparatus depth direction (Y direction in FIG. 4), so that the entire magnet unit 70 is moved in the apparatus depth direction (Y direction in FIG. 4). More specifically, due to the driving force generated by the driving unit 72b, the entire magnet unit 70 reciprocates between one end (negative side in the Y direction in FIG. 5) and the other end (positive side in the Y direction in FIG. 5) of the target 60 in the apparatus depth direction.

The driving unit 72b is controlled by a controller U to be described later.

As shown in FIG. 4, a pair of shielding members 80 are disposed at a position between the target 60 held by the target holder 50 and the wafer W placed on the substrate support 30 in the processing chamber 10, specifically, at a position between the target 60 and the slit plate 40. Each of the shielding members 80 is formed in a plate shape made of a conductive material, for example, a metal such as titanium or a stainless steel.

As shown in FIG. 6, each of the shielding members 80 extends in a direction from the target 60 held by the target holder 50 toward the wafer W serving as a film formation target. Specifically, each of the shielding members 80 extends in the apparatus height direction (Z direction in FIG. 6).

As shown in FIG. 7, each of the shielding members 80 is disposed on a boundary line B between a first region R1 and a second region R2 in plan view. The first region R1 is a region where only one of the magnet assemblies 100 passes therethrough during the reciprocating motion of the magnet unit 70 in the device apparatus direction (Y direction in FIG. 7) in plan view. The second region R2 is a region where both of the magnet assemblies 100 pass therethrough during the reciprocating motion of the magnet unit 70 in the apparatus depth direction (Y direction in FIG. 7).

As described above, by providing the shielding members 80, it is possible to prevent the sputtered particles from the central portion of the target 60 in the apparatus depth direction (Y direction in FIG. 6) from reaching the peripheral portion of the wafer W in the apparatus depth direction (Y direction in FIG. 6).

The shielding members 80 are connected to, e.g., one end of a support member (not shown) having the other end fixed to the lid 12. Thus, the shielding members 80 are supported by the support member.

Here, a distance L1 between the magnet assemblies 100 in the apparatus depth direction (Y direction in FIG. 7) will be described.

The distance L1 between the magnet assemblies 100 is set such that the first region R1 and second region R2 are formed. Specifically, the distance L1 between the magnet assemblies 100 is set such that a length L2 of the entire magnet unit 70 in the apparatus depth direction (Y direction in FIG. 7) becomes ½ or less than a length L3 of the target 60 in the apparatus depth direction (Y direction in FIG. 7).

However, the distance L1 between the magnet assemblies 100 may be set such that the length L2 of the entire magnet unit 70 in the apparatus depth direction (Y direction in FIG. 7) becomes slightly greater than ½ of the length L3 of the target 60 in the apparatus depth direction. In this case, the distance L1 between the magnet assemblies 100 is set to satisfy the following condition (A) so that erosion does not proceed excessively at the most central portion of the target 60 in the apparatus depth direction (Y direction in FIG. 7).

(A) As shown in FIG. 8, an erosion region A1, which is formed on the target 60 when the magnet unit 70 is located at one end of the target 60 in the apparatus depth direction (positive side in the Y direction in FIG. 8), and an erosion region A2, which is formed on the target 60 when the magnet unit 70 is located at the other end of the target 60 in the apparatus depth direction (negative side in the Y direction in FIG. 8), do not overlap with each other.

In other words, the above condition (A) is the same as to the following condition (B).

(B) A length L4 of the erosion region formed by the entire magnet unit 70 in the apparatus depth direction (Y direction in FIG. 8) is smaller than ½ of the length L3 of the target 60 in the apparatus depth direction.

When the distance L1 between the magnet assemblies 100 is reduced, the amount of heat input per unit area during one reciprocating motion of the magnet unit 70 is reduced. Thus, the target is less likely to melt, which is preferable. However, when the distance L1 is reduced too much, magnetic fields formed by the magnet assembly 100 interfere with each other, which makes it difficult to efficiently generate plasma. Therefore, the distance L1 between the magnet assemblies 100 is set to satisfy the condition that the magnetic fields formed by the magnet assemblies 100 do not interfere with each other.

All the above conditions are satisfied when the distance L1 between the magnet assemblies 100 is about twice the length of the magnet assembly 100 in the apparatus depth direction (Y direction in FIG. 8). In other words, all the above conditions can be satisfied when the gap between the magnet assemblies 100 in the depth direction of the device is equal to the width of one magnet assembly, for example.

Referring back to FIG. 4, a gas inlet member 90 is supported at the lid 12. The gas inlet member 90 supplies a gas from a gas supply source (not shown) into the processing chamber 10.

The film forming apparatus 1 includes the controller U. The controller U is, e.g., a computer having, for example, a CPU and a memory, and has a program storage unit (not shown). The program storage unit stores a program for controlling, for example, the substrate support moving mechanism 31 and the moving mechanism 72 and realizing a film forming process to be described of the film forming apparatus 1. The program may be stored in a computer-readable storage medium and installed on the controller U from the storage medium. A part or the entire program may be realized by a dedicated hardware (circuit board).

Figure 9:
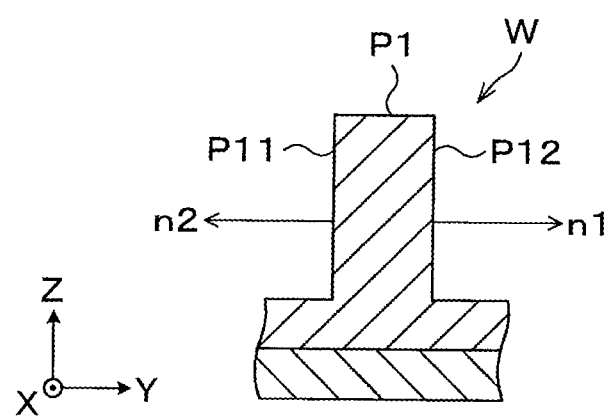
FIG. 9 is a cross-sectional view for explaining a wafer serving as a film formation target of the film forming apparatus.

Next, the film forming process performed by the film forming apparatus 1 will be described. FIG. 9 is a cross-sectional view for explaining a wafer serving as a film formation target of the film forming apparatus 1.

(Loading)

First, the wafer W is loaded into the processing chamber 10 having a desired pressure. Specifically, the gate valve 13 is opened, and a transfer mechanism (not shown) holding the wafer W is loaded from a transfer chamber (not shown) maintained in a vacuum atmosphere adjacent to the processing chamber 10 into the processing chamber 10 through the loading/unloading port 11b. Then, the wafer W is transferred to a position above lift pins (not shown) disposed near the loading/unloading port 11b in the processing chamber 10. During this transfer operation, the substrate support 30 is moved to a position where the lift pins are arranged. Next, the wafer W is delivered onto the raised lift pins (not shown). Then, the transfer mechanism is retreated from the processing chamber 10 and the gate valve 13 is closed. At the same time, the lift pins are lowered, and the wafer W is placed and held on the substrate support 30. Then, the substrate support 30 is moved in the apparatus width direction (X direction in FIG. 4) to a position where the wafer W on the substrate support 30 faces the target 60 through the slit 40a. Further, as shown in FIG. 9, the wafer W is placed on the substrate support 30 after the wafer W is oriented such that normal lines n1 and n2 of both side surfaces P11 and P12 of the pattern P1 having a rectangular cross section formed on the wafer W serving as a film formation target becomes parallel to the apparatus depth direction (Y direction in FIG. 9) orthogonal to the moving directions of the substrate support 30 (X direction in FIG. 9). In other words, when the pattern P1 formed on the wafer W is a line-and-space pattern, the wafer W is placed on the substrate support 30 after the wafer W is oriented such that the line of the pattern extends along the moving direction (X direction in FIG. 9) of the substrate support 30.

(Metal Film Formation)

Then, a metal film is formed by sputtering. Specifically, Ar gas is supplied into the processing chamber 10 through the gas inlet member 90, and a pressure in the processing chamber 10 is adjusted to a desired pressure by controlling a gas exhaust amount using the gas exhaust device 20. Further, a power is supplied from the power supply 52 to the target 60 through the target holder 50, and the magnet unit 70 repeatedly reciprocates on the target 60 along the apparatus depth direction (Y direction in FIG. 4). The frequency of the reciprocating motion of the magnet unit 70 is, for example, in a range of 0.25 Hz to 2.5 Hz. The Ar gas in the processing chamber 10 is ionized by the power from the power supply 52. Drift of the electrons generated by the ionization arises due to the magnetic field generated by the magnet unit 70 and the electric field generated by the power from the power supply 52, thereby generating high-density plasma. Due to Ar ions generated in the plasma, the surface of the target 60 is sputtered, and the sputtered particles are deposited on the wafer W to form a metal thin film. The metal thin film is formed on both side surfaces P11 and P12 of the pattern P1 on the wafer W in the apparatus depth direction (Y direction in FIG. 9), a side surface of one end of the pattern P1 in the moving direction of the substrate support 30 (negative side in the X direction in FIG. 9), and an upper surface of the pattern P1.

The magnitude (absolute value) of the moving speed of the magnet unit 70 along the apparatus depth direction during the film formation is, for example, constant.

Further, during the film formation, the substrate support 30 moves in one direction in the apparatus width direction (from the positive side toward the negative side in the X direction in FIG. 4). However, during the film formation, the substrate support 30 may reciprocate in the apparatus width direction (X direction in FIG. 4), or may be stationary without rotating or moving.

(Unloading)

Next, the wafer W is unloaded from the processing chamber 10. Specifically, the wafer W is unloaded to the outside of the processing chamber 10 in the reverse order of the loading process.

Then, the process returns to the loading process, and a wafer W serving as a next film formation target is processed in the same manner.

As described above, in the present embodiment, the film forming apparatus 1 for forming a film on the wafer W by magnetron sputtering includes the target holder 50 configured to hold the target 60 at a front side thereof such that the target 60 faces the wafer W serving as a film formation target and extends in the apparatus depth direction (Y direction), and the magnet unit 70 having the magnet assemblies 100 each of which is formed by arranging multiple magnets, the magnet unit 70 being disposed on the back side of the target holder 50. The film forming apparatus 1 further includes the pair of shielding members 80 disposed between the target 60 held by the target holder 50 and the wafer W to extend in a direction from the target 60 toward the wafer W, and the moving mechanism 72 configured to reciprocate the magnet unit 70 between one end and the other end of the target 60 held by the target holder 50 in the apparatus depth direction (Y direction).

Further, in the present embodiment, the magnet unit 70 includes a pair of the magnet assemblies 100 that are arranged along the apparatus depth direction, and each of the shielding members 80 is disposed, in plan view, on the boundary line B between the first region R1 where one of the magnet assemblies 100 passes therethrough during the reciprocating motion of the magnet unit 70 and the second region R2 where both of the magnet assemblies 100 pass therethrough during the reciprocating motion of the magnet unit 70.

Therefore, the sputtered particles from the central portion of the target 60 corresponding to the second region R2 are blocked by the shielding member 80 and do not reach the peripheral portion of the wafer W. Thus, at the peripheral portion of the wafer W, only the sputtered particles from the end portions of the target 60 in the apparatus depth direction (Y direction) corresponding to the first regions R1 reach the side surfaces of the pattern P1 formed at the peripheral portion of the wafer W. Accordingly, at the peripheral portion of the wafer W, there is no variation in the coating amount of the sputtered particles, i.e., the thickness of the sputtered film, between both side surfaces P11 and P12 of the pattern P1 in the apparatus depth direction (Y direction). In accordance with the present embodiment, it is possible to prevent the variation of the coating amount of the sputtered particles at the peripheral portion of the wafer.

Further, the sputtered particles from the end portions of the target 60 in the apparatus depth direction (Y direction) corresponding to the second region R2 are blocked by the shielding member 80 and do not reach the central portion of the wafer W. Thus, at the central portion of the wafer W, only the sputtered particles from the central portion of the target 60 in the apparatus depth direction (Y direction) corresponding to the first region R1 reach the side surfaces of the pattern P1 formed at the central portion of the wafer W. Therefore, even at the central portion of the wafer W, there is no variation in the coating amount of the sputtered particles, i.e., the thickness of the sputtered film, between both side surfaces P11 and P12 of the pattern P1 in the apparatus depth direction (Y direction).

Further, in the present embodiment, since the magnet unit 70 has the pair of magnet assemblies 100, a power density per unit area with respect to the target 60 is low, even when the same power as the case of using one magnet assembly 100 is inputted to the target 60. Therefore, when a high power is inputted to improve the film formation speed due to a low thermal conductivity of the material of the target 60, the increase in the crystal grain size on the surface of the target 60 or the melting of the target 60 does not occur.

Further, in the present embodiment, since the magnet unit 70 is moved, specifically reciprocated, with respect to the target 60, the target 60 is not exposed to plasma for a long period of time. Therefore, from this point of view as well, when a high power is inputted to improve the film formation speed due to a low thermal conductivity of the material of the target 60, the increase in the crystal grain size on the surface of the target 60 or the melting of the target 60 does not occur.

In the above description, each of the shielding members 80 is disposed on the boundary line B between the first region R1 and the second region R2. However, the position of the shielding member 80 in plan view does not necessarily completely coincide with the boundary line B. The shieling members 80 may be positioned away from the boundary line B in plan view if the sputtered particles from the central portion of the target 60 corresponding to the second region R2 can be shielded by the shielding member 80 without reaching the peripheral portion of the wafer W.

Further, in the present embodiment, the length L2 of the entire magnet unit 70 in the apparatus depth direction (Y direction in FIG. 7) is set to be ½ or less than the length L3 of the target 60 in the apparatus depth direction (Y direction in FIG. 7) so that the first region R1 and the second region R2 can be formed. Then, the magnet unit 70 is reciprocated in the apparatus depth direction (Y direction in FIG. 7). Therefore, the entire target 60 can be used.

Next, another example of the moving speed of the magnet unit 70 during the reciprocating motion will be described.

In the above examples, the magnitude of the moving speed of the magnet unit 70 during the reciprocating motion is set to be constant. However, the magnitude of the moving speed during the reciprocating motion is not necessarily constant.

For example, the moving speed of the magnet unit 70 during the reciprocating motion may be set to be lower in a section where the magnet unit 70 is located at an outer side in the apparatus depth direction (Y direction) in a plan view than in other sections. Specifically, the moving speed of the magnet unit 70 during the reciprocating motion may be set to be lower in a low-speed section T1 where the magnet unit 70 faces the end of the target 60 in the apparatus depth direction (Y direction) than in the other section T2.

Therefore, the amount of sputtered particles emitted from the central portion of the target 60 in the depth direction (Y direction) corresponding to the second region R2 during the reciprocating motion becomes greater than the amount of sputtered particles emitted from the end of the target 60 in the apparatus depth direction (Y direction) corresponding to the first region R1 during the reciprocating motion. Accordingly, for the peripheral portion of the wafer W corresponding to the first region R1 where a relatively smaller amount of sputtered particles reach and a film thickness tends to be small, the relatively increased number of sputtered particles reach the peripheral portion of the wafer W, so that the in-plane uniformity of the thickness of the wafer W can be obtained. Further, it is possible to more reliably prevent the variation in the coating amount of the sputtered particles at the peripheral portion of the wafer.

As shown in FIG. 7, for example, the low-speed section T1 indicates a section where the center of the outer magnet assembly 100 between the pair of magnet assemblies 100 is located at an outer region R12 between two regions that are formed by dividing the first region R1 along the apparatus depth direction (Y direction in FIG. 7) in plan view. When the outer magnet assembly 100 between the pair of magnet assemblies 100 is located at an inner region compared to the outer region R12 in the apparatus depth direction (Y direction in FIG. 7), it may not be possible for the shielding member 80 disposed on the boundary line B to prevent the sputtered particles generated by the inner magnet assembly 100 from reaching the peripheral portion of the wafer W. Hence, the low speed section T1 is set as described above.

Hereinafter, a moving process of the magnet unit 70 in a film forming method of the present example will be described. FIGS. 10A to 10D are diagrams for explaining a specific example of the moving process of the magnet unit 70.

Figure 10A:
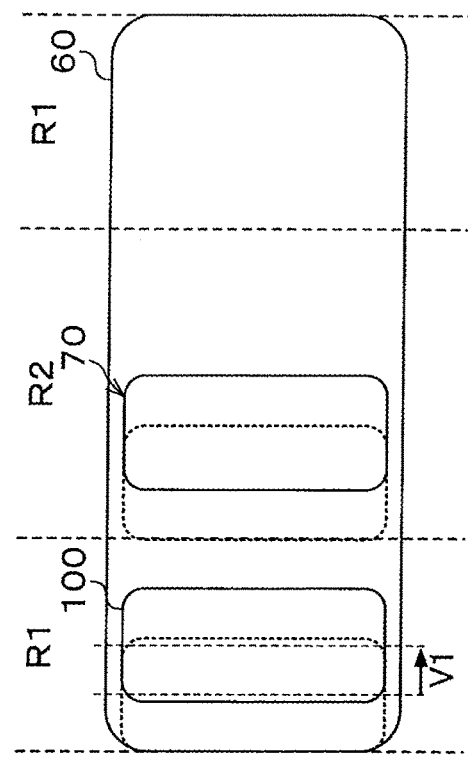
FIGS. 10A to 10D are diagrams for explaining a specific example of a magnet unit moving process.
Figure 10B:
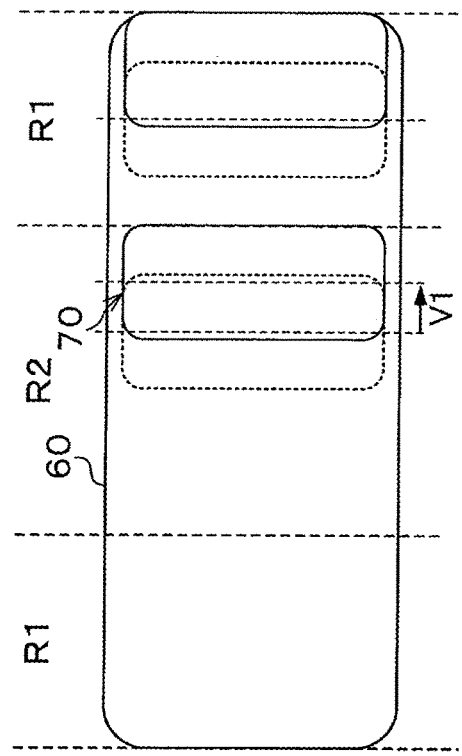
Figure 10C:
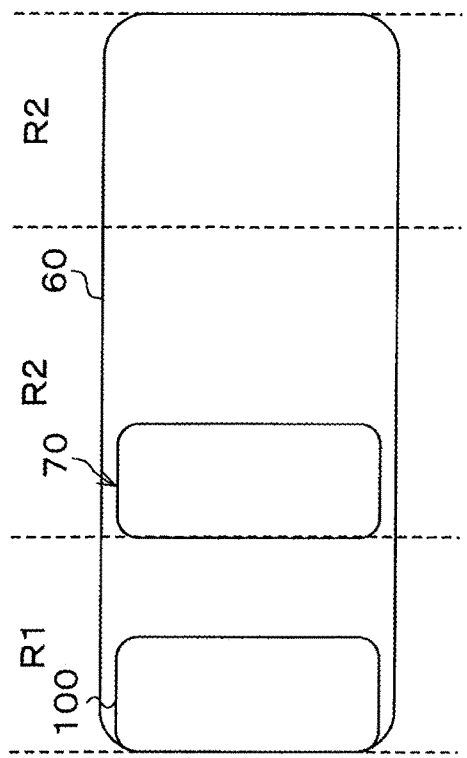
Figure 10D:
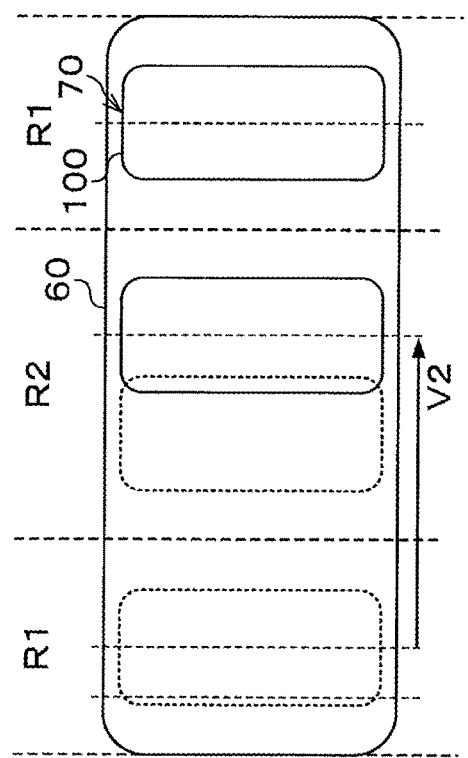

The magnet unit 70 moves at a first speed V1 from the state in which the magnet unit 70 is located at one end (left side in FIG. 10A) in the apparatus depth direction as shown in FIG. 10A to the state in which the center of the magnet assembly 100 arranged at one side (left side in FIG. 10A) in the apparatus depth direction reaches the center of the first region R1 on the left side in the apparatus depth direction as shown in FIG. 10B. Next, as shown in FIG. 10C, the magnet unit 70 moves at a second speed V2 higher than the first sped V1 until the center of the magnet assembly 100 at the other side (right side in FIG. 10C) in the apparatus depth direction reaches the center of the opposite first region R1 on the right side in the apparatus depth direction. Then, as shown in FIG. 10D, the magnet unit 70 moves at the first speed V1 until the magnet unit 70 reaches the other end (right side in FIG. 10D) in the apparatus depth direction.

Further, the moving speed of the magnet unit 70 in the low-speed section T1, i.e., the first speed V1, is, e.g., ⅕ to ½ of the moving speed in the section T2, i.e., the second speed V2.

Here, the distance L1 between the magnet assemblies 100 in the apparatus depth direction (Y direction in FIG. 7) in the present example will be described.

If the distance L1 between the magnet assemblies 100 is too short, the magnetic fields generated by the magnet assemblies 100 interfere with each other. Therefore, unexpected magnetic field is generated.

However, if the distance L1 between the magnet assemblies 100 is too long, the magnet assemblies 100 may not pass a certain region of the target 60 during the reciprocating motion of the magnet unit 70 in plan view. Further, if the distance L1 is too long, the distance for acceleration/deceleration of the magnet unit 70 is not ensured, which makes it difficult to reduce the moving speed of the magnet unit 70 during the reciprocating motion in the low speed section T1 where the magnet unit 70 faces the end portion of the target 60 in the apparatus depth direction (Y direction). Accordingly, the in-plane uniformity of the thickness of the sputter film on the wafer W is not obtained, and the target 60 is non-uniformly consumed.

Therefore, the distance L1 between the magnet assemblies 100 is preferably short. However, if the distance L1 is too short, the interference of the magnetic fields occurs. Thus, the distance L1 is set to be longer than ½ of the width of the magnet assembly 100. The present inventors have studied that the interference of the magnetic fields does not occur when the distance L1 between the magnet assemblies 100 is more than ½ of the width of the magnet assembly 100.

In the above examples, the magnet unit has two magnet assemblies arranged along the apparatus depth direction. However, the number of the magnet assemblies may be three or more. In that case, in plan view, the shielding member is disposed on the boundary line between the first region where one of the n-number of magnet assemblies (n being 3 or more) passes during the reciprocating motion of the magnet unit 70 and the second region where two of the n-number of magnet assemblies pass during the reciprocating motion of the magnet unit 70. The shielding member is also disposed on the boundary line between the second region and the third region where three of the n-number of magnet assemblies pass during the reciprocating motion of the magnet unit 70.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A film forming apparatus for forming a film on a substrate by magnetron sputtering, comprising:
   a target holder configured to hold a target at a front side such that the target faces the substrate serving as a film formation target and extends in a predetermined direction on a horizontal plane;
   a magnet unit including at least a pair of magnet assemblies, each of which is formed by arranging multiple magnets, the magnet unit being disposed at a back side of the target holder;
   a pair of shielding members disposed between the target held by the target holder and the substrate, each of the shielding members being formed in a plate shape and extended in a direction from the target toward the substrate; and
   a moving mechanism configured to reciprocate the magnet unit between one end and the other end in the predetermined direction of the target held by the target holder,
   wherein the pair of the magnet assemblies are arranged along the predetermined direction, and
   each of the shielding members is disposed, in plan view, on a boundary line between a first region where only one of the magnet assemblies of the pair passes therethrough during a reciprocating motion of the magnet unit and a second region where both of the magnet assemblies of the pair pass therethrough during the reciprocating motion of the magnet unit so that sputtered particles from a central portion of the target corresponding to the second region are prevented from reaching a peripheral portion of the substrate by the shielding member.

2. The film forming apparatus of claim 1, wherein the substrate serving as the film formation target has a pattern having a rectangular cross section on a surface thereof.

3. The film forming apparatus of claim 1, wherein the substrate serving as the film formation target is moved in a direction orthogonal to the predetermined direction on the horizontal plane during film formation.

4. The film forming apparatus of claim 2, wherein the substrate serving is moved in a direction orthogonal to the predetermined direction on the horizontal plane during film formation.

5. The film forming apparatus of claim 1, wherein the moving mechanism moves the magnet unit in a low-speed section where the magnet unit faces an end portion of the target held by the target holder in the predetermined direction at a speed lower than a speed in another section.

6. The film forming apparatus of claim 2, wherein the moving mechanism moves the magnet unit in a low-speed section where the magnet unit faces an end portion of the target held by the target holder in the predetermined direction at a speed lower than a speed in another section.

7. The film forming apparatus of claim 3, wherein the moving mechanism moves the magnet unit in a low-speed section where the magnet unit faces an end portion of the target held by the target holder in the predetermined direction at a speed lower than a speed in another section.

8. The film forming apparatus of claim 5, wherein the low-speed section is a section where a center of an outer magnet assembly between the pair of magnet assemblies is located at an outer region between two regions that are formed by dividing the first region along the predetermined direction.

9. The film forming apparatus of claim 7, wherein the low-speed section is a section where a center of an outer magnet assembly between the pair of magnet assemblies is located at an outer region between two regions that are formed by dividing the first region along the predetermined direction.

10. The film forming apparatus of claim 5, wherein a moving speed of the magnet unit in the low-speed section is ⅕ to ½ of a moving speed of the magnet unit in the other section.

11. The film forming apparatus of claim 7, wherein a moving speed of the magnet unit in the low-speed section is ⅕ to ½ of a moving speed of the magnet unit in the other section.

12. The film forming apparatus of claim 8, wherein a moving speed of the magnet unit in the low-speed section is ⅕ to ½ of a moving speed of the magnet unit in the other section.

13. The film forming apparatus of claim 9, wherein a moving speed of the magnet unit in the low-speed section is ⅕ to ½ of a moving speed of the magnet unit in the other section.

14. A film forming method for forming a film on a substrate by magnetron sputtering using a film forming apparatus, the film forming apparatus including: a target holder configured to hold a target at a front side such that the target faces the substrate serving as a film formation target and extends in a predetermined direction on a horizontal plane;

a magnet unit including at least a pair of magnet assemblies each of which is formed by arranging multiple magnets, the magnet unit being disposed at a back side of the target holder;

and a pair of shielding members disposed between the target held by the target holder and the substrate as a film formation target, each of the shielding members being formed in a plate shape and extended in a direction from the target toward the substrate, the pair of the magnet assemblies being arranged in the predetermined direction, the film forming method comprising:

reciprocating the magnet unit between one end and the other end in the predetermined direction of the target held by the target holder, wherein each of the shielding members is disposed, in plan view, on a boundary line between a first region where only one of the magnet assemblies of the pair passes therethrough during a reciprocating motion of the magnet unit and a second region where both of the magnet assemblies of the pair pass therethrough during the reciprocating motion of the magnet unit so that sputtered particles from a central portion of the target corresponding to the second region are prevented from reaching a peripheral portion of the substrate by the shielding member, wherein said reciprocating includes:

moving the magnet unit at a first speed in a section where the magnet unit faces an end portion of the target held by the target holder in the predetermined direction; and moving the magnet unit at a second speed higher than the first speed in another section.

* * * * *